United States Patent
Cheng

(10) Patent No.: US 10,999,949 B2
(45) Date of Patent: May 4, 2021

(54) ACCESSORY APPARATUS FOR ELECTRONIC DEVICE HAVING PAGE-TURNING FUNCTION, ELECTRONIC DEVICE AND ELECTRONIC DEVICE ASSEMBLY

(71) Applicants: ZHANGYUE TECHNOLOGY CO., LTD, Beijing (CN); SHENZHEN ZHANGYUE TECHNOLOGY CO., LTD, Shenzhen (CN)

(72) Inventor: Chao Cheng, Beijing (CN)

(73) Assignees: ZHANGYUE TECHNOLOGY CO., LTD, Beijing (CN); SHENZHEN ZHANGYUE TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 16/647,318

(22) PCT Filed: Dec. 20, 2017

(86) PCT No.: PCT/CN2017/117581
§ 371 (c)(1),
(2) Date: Mar. 13, 2020

(87) PCT Pub. No.: WO2019/085220
PCT Pub. Date: May 9, 2019

(65) Prior Publication Data
US 2020/0245490 A1    Jul. 30, 2020

(30) Foreign Application Priority Data

Oct. 31, 2017    (CN) .......................... 201711063086.2
Oct. 31, 2017    (CN) .......................... 201721442845.1

(51) Int. Cl.
*G06F 1/00* (2006.01)
*H05K 7/14* (2006.01)
(Continued)

(52) U.S. Cl.
CPC .......... *H05K 7/1427* (2013.01); *G06F 1/181* (2013.01); *H05K 1/0277* (2013.01)

(58) Field of Classification Search
CPC ..... H05K 7/1427; H05K 1/0277; G06F 1/181
See application file for complete search history.

(56) References Cited

U.S. PATENT DOCUMENTS

2010/0238119 A1* 9/2010 Dubrovsky ......... G06F 3/04886
345/169
2010/0302168 A1* 12/2010 Giancarlo ............... G06F 3/041
345/169

(Continued)

FOREIGN PATENT DOCUMENTS

| CN | 201331848 Y | 10/2009 |
|---|---|---|
| CN | 201812227 U | 4/2011 |
| CN | 204790953 U | 11/2015 |

OTHER PUBLICATIONS

International Patent Application No. PCT/CN2017/117581; Int'l Search Report; dated Jul. 20, 2018; 2 pages.

*Primary Examiner* — Peter T Lee
(74) *Attorney, Agent, or Firm* — BakerHostetler

(57) ABSTRACT

The disclosure provides an accessory apparatus for an electronic device having a page-turning function, an electronic device and an electronic device assembly. The accessory apparatus comprises: a protective cover, which partially or completely wraps the electronic device and directly attaches to a back of the electronic device, wherein the protective cover is connected to an outer surface of the electronic device; a page-turning button, which is configured to perform a page-turning operation; a flexible printed circuit, which is provided with a page-turning triggering component, wherein the page-turning triggering component is in contact with the page-turning button and is configured to detect a page-turning instruction in response to the (Continued)

page-turning operation, and wherein the page-turning instruction is transmitted to the electronic device by the flexible printed circuit and a support member, which is configured to support the flexible printed circuit.

17 Claims, 4 Drawing Sheets

(51) Int. Cl.
    *G06F 1/18*       (2006.01)
    *H05K 1/02*       (2006.01)

(56) References Cited

U.S. PATENT DOCUMENTS

2011/0017634 A1    1/2011    Sweeney
2014/0055363 A1*    2/2014    Meierling ............. G06F 1/1662
                                                                      345/169

* cited by examiner

ACCESSORY APPARATUS FOR ELECTRONIC DEVICE HAVING PAGE-TURNING FUNCTION, ELECTRONIC DEVICE AND ELECTRONIC DEVICE ASSEMBLY

CROSS-REFERENCE TO RELATED APPLICATION

The present application is the U.S. National Stage of International Application No. PCT/CN2017/117581, filed on Dec. 20, 2017, which claims priority to Chinese Patent Applications No.201711063086.2, with a title of invention of "ACCESSORY APPARATUS FOR ELECTRONIC DEVICE HAVING PAGE-TURNING FUNCTION", and No.201721442845.1, with a title of utility model of "ACCESSORY APPARATUS FOR ELECTRONIC DEVICE HAVING PAGE-TURNING FUNCTION", filed before the China Patent Office on Oct. 31, 2017, the entire contents of which are incorporated herein by reference.

TECHNICAL FIELD

The present application relates to the technical field of structure of an accessory for an electronic device, and in particular, to an accessory apparatus for an electronic device having a page-turning function.

BACKGROUD

With the advancement of society and the continuous improvement of people's living standards, mobile terminals such as e-readers and cell phones have become popular and have become the main tools for people to work or entertain. With the continuous development of technology, the mobile terminals also have more functions. As a result, there are also more electronic components inside the mobile terminals, the screens of the mobile terminals are getting bigger, the battery capacities are constantly increasing, and a variety of layouts of the sensors are getting denser, which lead to increasingly complicated assembly of the mobile terminals. In the meantime, the requirements of users for the thinning of the mobile terminals are getting higher, which results in that, in the process of the thinning of the mobile terminals, the electronic devices such as the mobile terminals may easily damaged by factors such as dropping. To this end, the accessory apparatuses such as protective covers of the electronic devices have been widely used.

The accessory apparatus for the electronic device in the prior art usually covers the peripheral buttons on the electronic device, which leads to a problem that, when the user presses a button on the electronic device, it needs more force to make the button work. For a button on the electronic device (such as a page-turning button) which is frequently used, in the case that there is an accessory apparatus for the electronic device, it usually causes poor user experience.

Therefore, there is a need for a newly designed accessory apparatus for the electronic device having a page-turning function.

TECHNICAL PROBLEM

In view of this, an embodiment of the present application provides an accessory apparatus for an electronic device having a page-turning function, which at least partially solves the problems existing in the prior art.

SUMMARY

An embodiment of the present application provides an accessory apparatus for an electronic device having a page-turning function, including:

a protective cover, which partially or completely wraps the electronic device and directly attaches to a back of the electronic device, wherein the protective cover is connected to an outer surface of the electronic device;

a page-turning button, which is configured to perform a page-turning operation;

a flexible printed circuit, which is provided with a page-turning triggering component, wherein the page-turning triggering component is in contact with the page-turning button and is configured to detect a page-turning instruction in response to the page-turning operation, and wherein the page-turning instruction is transmitted to the electronic device by the flexible printed circuit; and a support member, which is configured to support the flexible printed circuit.

An embodiment of the present application further provides an electronic device which comprises contacts, wherein the contacts receives the page-turning instruction as described above to perform the page-turning operation.

An embodiment of the present application further provides an electronic device assembly, including:

an electronic device;

a protective cover, which partially or completely wraps the electronic device and directly attaches to a back of the electronic device, wherein the protective cover is connected to an outer surface of the electronic device;

a page-turning button, which is configured to perform a page-turning operation;

a flexible printed circuit, which is provided with a page-turning triggering device, wherein the page-turning triggering device is in contact with the page-turning button, and is configured to detect a page-turning instruction in response to the page-turning operation, and wherein the page-turning instruction is transmitted to the electronic device by the flexible printed circuit; and a support member, which is configured to support the flexible printed circuit.

BENEFICIAL EFFECT

In the accessory apparatus for the electronic device having a page-turning function provided by an embodiment of the present application, the page-turning button is fitted and mounted on the accessory, the page-turning button is disposed on the support member. Through the page-turning button in contact with the page-turning triggering component on the flexible printed circuit, and with the electrical connection of the flexible printed circuit with the electronic device, the accessory apparatus for the electronic device is enabled to realize the page-turning function of the electronic device while protecting the electronic device.

BRIEF DESCRIPTION OF THE DRAWINGS

In order to more clearly illustrate the technical solution of the embodiment of the present application, the drawings to be used in the embodiment will be briefly described below. It is obvious that the drawings in the following description are only some embodiments of the present application. One of ordinary skill in the art can also obtain other drawings based on these drawings without paying creative effort.

DETAILED DESCRIPTION

The embodiments of the present application are described in detail below in connection with the accompanying drawings.

It should be understood that the described embodiments are only a part of the embodiments of the present application, and not all of the embodiments. All other embodiments obtained by a person of ordinary skill in the art based on the embodiments in the present application without paying inventive labor belong to the scope protected by the present application.

The accessory apparatus for an electronic device described in the present embodiment refers to a matching component that can be disassembled and installed with respect to the electronic device, which is usually a protective cover/shell of the electronic device in practical applications (which is collectively referred to as a protective cover hereinafter for convenience of description). The embodiment of the present application is described hereinafter by taking a protective cover as an example. It should be understood that the specific form, function, and specific connection relationship with the electronic device of the accessory apparatus are not limited to the protective cover.

Figure 1:
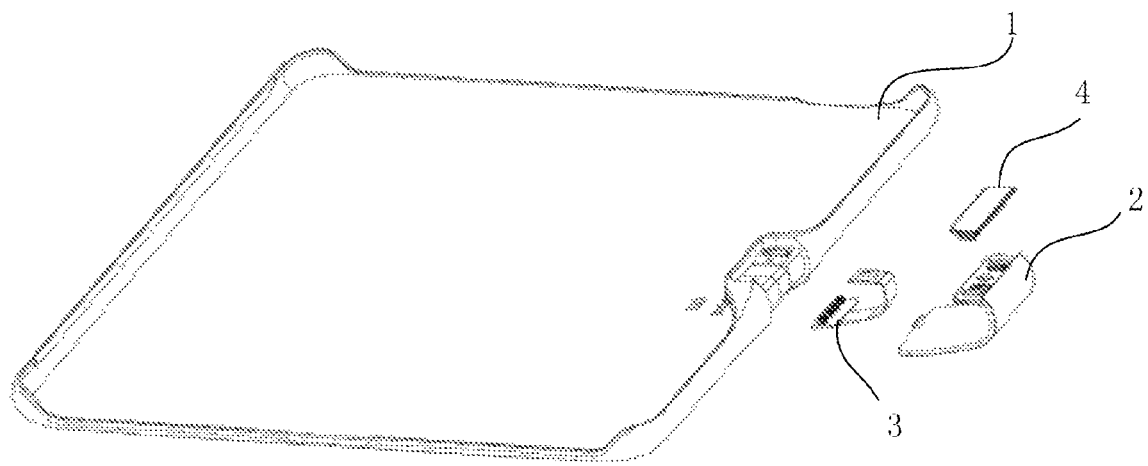
FIG. 1 is a schematic diagram of the structure before assembly of an accessory apparatus for an electronic device having a page-turning function provided by an embodiment of the present application.

Referring to FIG. 1, an embodiment of the present application provides an accessory apparatus for an electronic device having a page-turning function, including: a protective cover 1, a support member 2, a flexible printed circuit 3, and a page-turning button 4.

The protective cover 1 is a main part of the accessory apparatus for the electronic device, and is mainly configured to wrap outside the electronic device to prevent damage of the electronic device due to dropping or the like. According to actual needs, the protective cover 1 can partially or completely wrap the electronic device. The protective cover 1 may be made of a flexible material or may be made of other deformable materials, and the protective cover 1 is connected to the outer surface of the electronic device after the accessory apparatus for the electronic device is mounted on the electronic device.

The support member 2 is mainly used for supporting and fixing the flexible printed circuit 3 and the page-turning button 4. For this purpose, a corresponding slot structure, which is matched with the support member 2, is provided at the corresponding position of the protective cover 1, so that the support member 2 is fixedly connected to the protective cover 1. After the support member 2 is fixed on the protective cover 1, on the one hand, the flexible printed circuit 3 can be clamped and fixed between the protective cover 1 and the support member 2, and in the meantime the page-turning button 4 is also supported and fixed through a specific structure by the support member 2.

In order to be able to detect a page-turning instruction on the accessory apparatus for the electronic device and to transmit the detected page-turning instruction to the electronic device, the flexible printed circuit 3 is provided, and the flexible printed circuit 3 is located between the protective cover 1 and the support member 2. At one end of the flexible printed circuit 3, the flexible printed circuit 3 has a circuit interface electrically connected to the electronic device. The circuit interface can transmit the page-turning instruction in response to the page-turning operation by page-turning button 4 to the electronic device. In the meanwhile, at the other end of the flexible printed circuit 3, the flexible printed circuit 3 is provided with a page-turning triggering component for detecting a page-turning instruction in response to the button behavior of the page-turning button 4.

In order to facilitate the user to perform the page-turning operation, the page-turning button 4 is provided, and the page-turning button 4 can be a common conventional button. The page-turning button 4 is disposed on the support member 2, so that when the user holds the accessory apparatus for the electronic device, a single point button operation is directly performed by the thumb or other types of fingers. In order to ensure that the button operation of the page-turning button 4 can be detected, the page-turning button 4, after being installed (see FIG. 2), can be brought into contact with the page-turning triggering component on the flexible printed circuit 3. Thus, the page-turning instruction in response to a page-turning operation by the page-turning button 4 can be transmitted to the corresponding electronic device through the flexible printed circuit 3 (see FIG. 3).

Figure 4A:
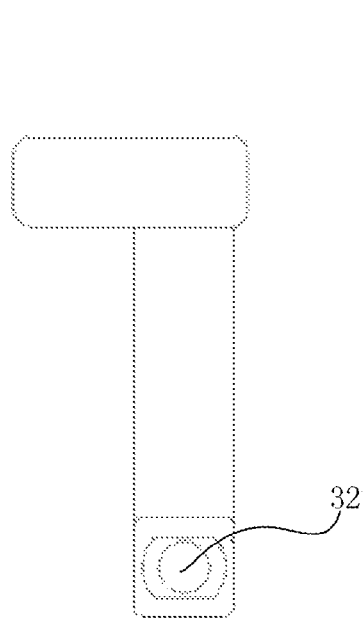
FIG. 4a-4c are schematic diagrams of the structure of the flexible printed circuit provided by an embodiment of the present application at different viewing angles.
Figure 4B:
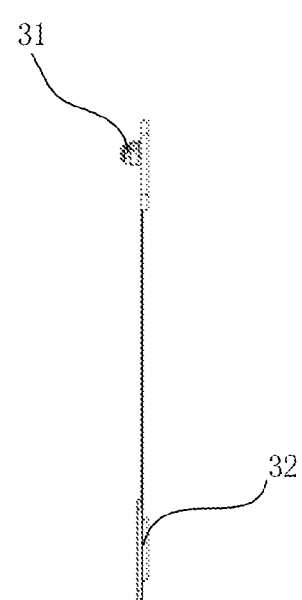
Figure 4C:
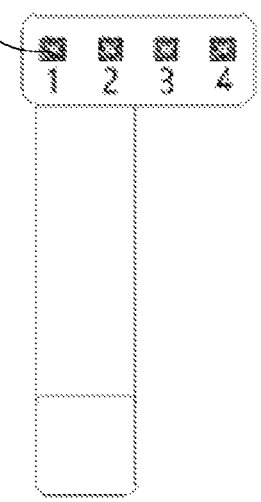

The circuit interface of the flexible printed circuit 3 can be fabricated in various manners. Referring to FIG. 4a-4c, according to a specific implementation of the embodiment of the present application, the circuit interface of the flexible printed circuit 3 is a plurality of metal contacts 31. In this way, the corresponding electronic device is also provided with contacts corresponding to the plurality of metal contacts 31. The flexible printed circuit 3 can be connected to the electronic device through the metal contacts 31.

Since the electronic device is wrapped inside the protective cover 1 and the flexible printed circuit 3 is disposed outside the protective cover 1, in order to be able to ensure that the metal contacts 31 on the flexible printed circuit 3 can be electrically connected to the electronic device, according to a specific implementation of the embodiment of the present application, the protective cover 1 has a plurality of holes, and the plurality of metal contacts 31 are connected with the electronic device through the plurality of holes. After the metal contacts 31 are brought in contact with the contacts of the electronic device on the protective cover 1, the signals are turned on. Since the metal contacts 31 are exposed to the air for a long time, in order to ensure the stability of the metal contacts 31, a gold plating operation can be performed on the metal contacts 31.

In order to facilitate the detection of the button operation of the page-turning button 4, and in the meantime to ensure that the page-turning button 4 can automatically pop up after being pressed, according to a specific implementation of the embodiment of the present application, the page-turning triggering component is an elastic metal member. As an example, the elastic metal member can be a common metal dome. The metal dome has good conduction performance, and can perform a good function of switch activation and control between the operator and the product, and at the same time the metal dome has a stable resilience (automatic returning after pressing) which can give the operator a comfortable sense of touch.

Figure 5:
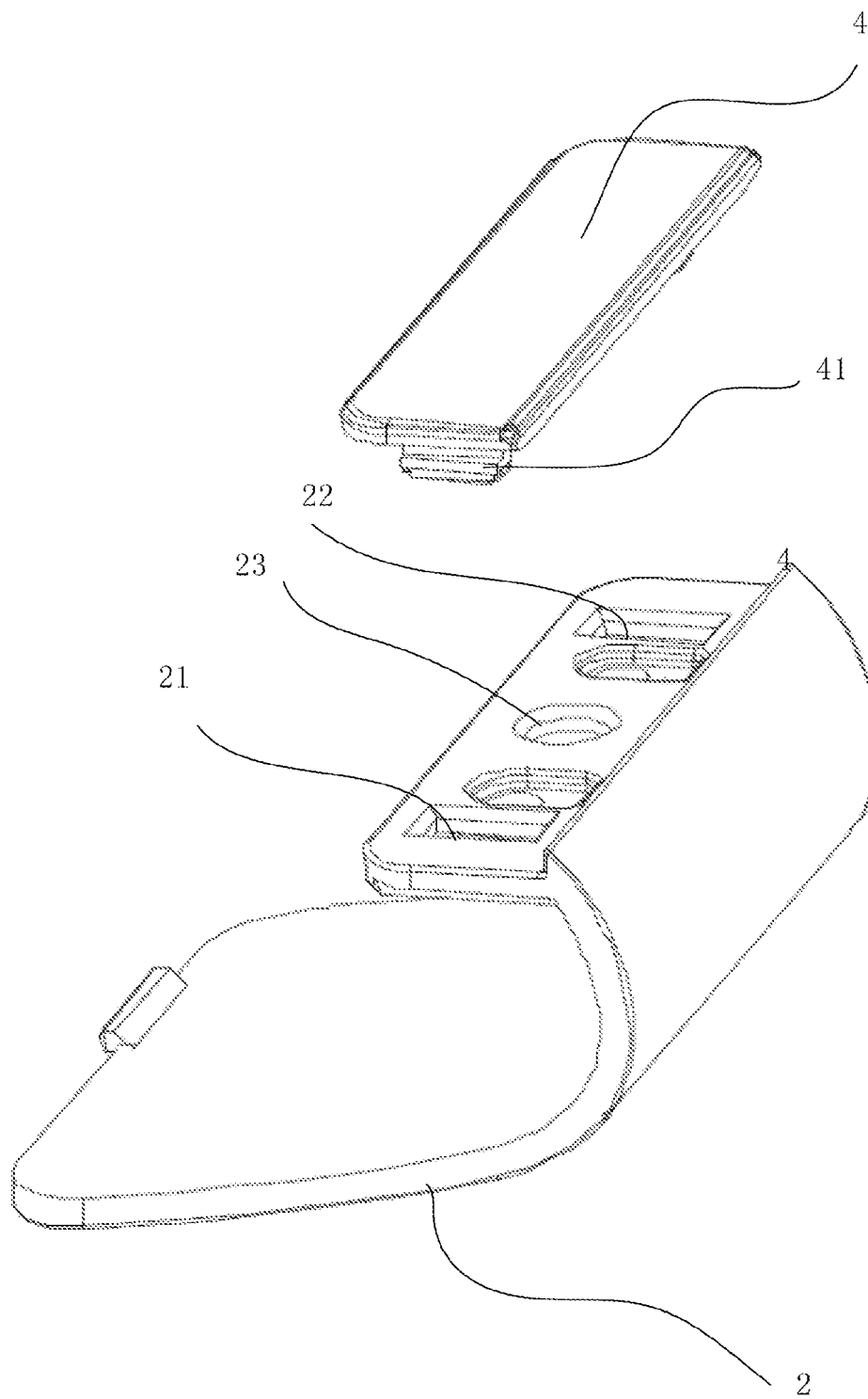
FIG. 5 is a schematic diagram of assembly of the flexible printed circuit and a page-turning button provided by an embodiment of the present application.

The page-turning button 4 needs to be fixed on the support member 2. In order to facilitate the fixing of the page-turning button 4, according to a specific implementation of the embodiment of the present application, referring to FIG. 5, the page-turning button 4 has a first convex portion 41 disposed at the first end and a second convex portion (not shown) disposed at the second end. By providing the first convex portion 41 and the second convex portion, the page-turning button 4 has fixed fulcrums at both ends, which facilitates the fixing of the page-turning button 4.

Corresponding to the provision of the first convex portion 41 and the second convex portion in the page-turning button 4, according to a specific implementation of the embodiment of the present application, the support member 2 has a first concave portion 21 for fitting the first convex portion 41 and a second concave portion 22 for fitting the second convex portion. With the above-described structural arrangement, it is possible to ensure stable support and fixation of the page-turning button 4 by the support member 2. The side walls of the first convex portion 41 and the second convex portion as described above are respectively provided with a block, and the side walls of the first concave portion 21 and the second concave portion 22 are respectively provided with a slot that is engaged with the block, which facilitates the buckle connection of the page-turning button 4 and the support member 2.

The support member 2 needs to ensure that the page-turning button 4 and the flexible printed circuit 3 are in contact. According to a specific implementation of the embodiment of the present application, the support member 2 has a third concave portion 23 for fitting the page-turning triggering component. The page-turning button 4 is in contact with the page-turning triggering component through the third concave portion 23.

The page-turning button 4 and the supporting member 2 can be fitted and installed in a plurality of manners. According to a specific implementation of the embodiment of the present application, the page-turning button 4 is connected to the supporting member 2 through a buckle manner.

The support member 2 and the protective cover 1 can also be fixedly connected in a plurality of ways. According to a specific implementation of the embodiment of the present application, the support member 2 is connected to the protective cover 1 through at least one of screw, buckle, adhesive, gelatinize or ultrasound.

The above described respective figures are designed for the right-handed users. In practical applications, the page-turning function structure composed of the support member 2, the flexible printed circuit 3 and the page-turning button 4 can also be integrally disposed on the opposite side of the protective cover 1 to facilitate the use of the left-handed users.

Further, it is also conceivable to provide a page-turning function structure on each of the left and right sides of the protective cover 1, that is, the page-turning function structure in the right side position is as shown in the above described respective figures; in order to simplify the process, the provision of the flexible printed circuit 3 in the page-turning function structure on the left side may be omitted, and an electrical connection relationship between the second page-turning button disposed on the left side and the flexible printed circuit 3 on the right side is established, so that the page-turning buttons 4 on the left and right sides share the flexible printed circuit 3 on the right side. Wherein, when the above described electrical connection relationship is realized by a physical component (for example, a wire), in order to ensure the aesthetic appearance of the protective cover 1, the physical component may be buried in the material of the protective cover 1.

Figure 2:
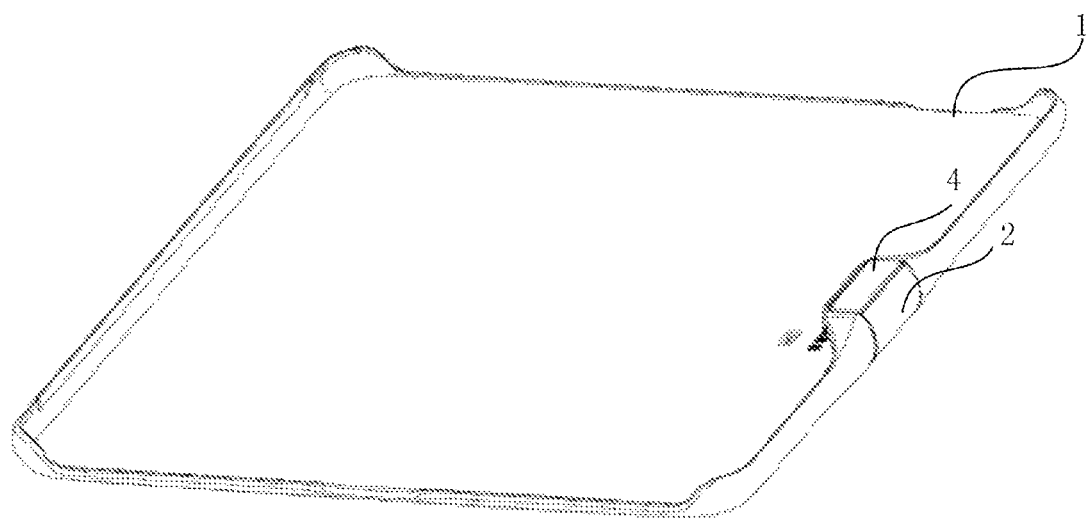
FIG. 2 is a schematic diagram of the structure after assembly of the accessory apparatus for the electronic device having the page-turning function provided by an embodiment of the present application.
Figure 3:
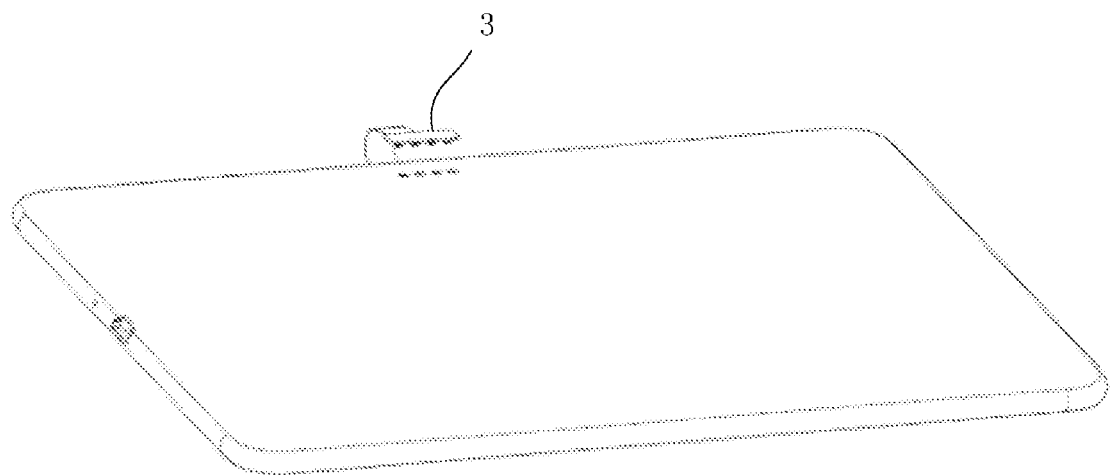
FIG. 3 is a schematic diagram of electrical connection between a flexible printed circuit and the electronic device provided by an embodiment of the present application.
Figure 6:
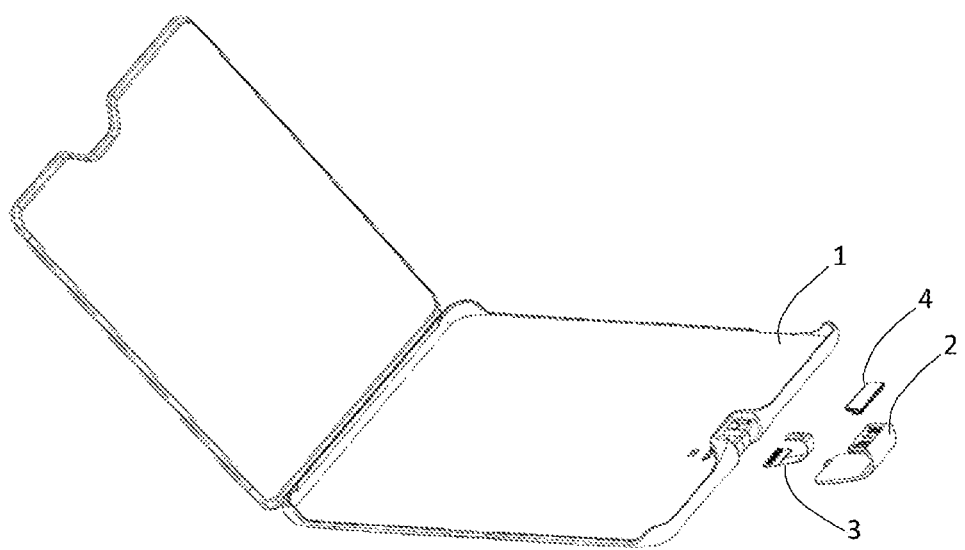
FIG. 6 is a schematic diagram of the structure before assembly of another accessory apparatus for an electronic device having a page-turning function provided by an embodiment of the present application.

In addition to the protective cover 1 shown in FIG. 1 to FIG. 3, the present embodiment is also applicable to the protective cover 1 shown in FIG. 6, that is, a clamshell protective cover with a screen protection function. In practical applications, all covers, sleeves and bags, which can attach directly to the back of the electronic device and be configured to protect the electronic device, belong to the protective cover 1 described in the present embodiment.

The above described embodiment has been described by taking the protective cover 1 as an example. In addition, the accessory described in the present embodiment may also have other forms, for example:

The accessory may specifically be a piece of strap having a length equal to the width of the electronic device and a width less than the length of the electronic device. The strap may be made of the same material as the traditional protective cover, such as leather or plastic, or may also be made of the material different from the traditional protective cover, such as a soft cord, a spring material or the like. One end of the strap is buckled and connected at one end of the electronic device through a buckle mechanism or elasticity of the hard material itself, and the other end of the strap is connected with the above described page-turning function structure. Specifically, the other end of the strap is fixedly connected to the support member 2 of the above described page-turning function structure, and buckled and connected at the other end of the electronic device through the buckle mechanism provided on the support member 2, so that the page-turning function structure is detachably fixed onto the electronic device, and the metal bumps are docked to the corresponding connection positions on the electronic device. Alternatively, a magnetic material may also be used to make the strap, and the strap may be directly attached to the back of the electronic device. In this case, the buckle mechanism may no longer be provided at one end of the strap and the support member 2.

As another example, the accessory may specifically be a bearing piece for the above described page-turning function structure, the bearing surface of which is fixedly connected with the support member 2, for bearing the page-turning function structure; and which is detachably fixed to one end of the electronic device through clamping, magnet attraction, buckle and the like and enables the metal bumps to be docked to corresponding connection positions on the electronic device.

The foregoing is only a specific embodiment of the present application, but the protection scope of the present application is not limited thereto, and any change or replacement that can be easily conceived by those skilled in the art within the technical scope disclosed by the present application, all should be covered by the protection scope of the present application. Therefore, the protection scope of the present application should be determined by the protection scope of the claims.

What is claimed is:

1. An accessory apparatus for an electronic device having a page-turning function, comprising: a protective cover, which partially or completely wraps the electronic device and directly attaches to a back of the electronic device, wherein the protective cover is connected to an outer surface of the electronic device; a page-furring button, which is configured to perform a page-turning operation; a flexible printed circuit, which is provided with a page-turning triggering component, wherein the page-turning triggering component is in contact with the page-turning button and is configured to detect a page-turning instruction in response to the page-turning operation, and wherein the page-turning instruction is transmitted to the electronic device by the flexible printed circuit; and a support member, which is configured to support the flexible printed circuit; wherein the page-turning button has a first convex portion disposed at a first end and a second convex portion disposed at a second end, and the support member has a first concave portion for fitting the first convex portion and a second concave portion for fitting the second convex portion.

2. The accessory apparatus according to claim 1, wherein the flexible printed circuit has a circuit interface for electrically connecting with the electronic device, the circuit interface is a plurality of metal contacts, and the protective cover has a plurality of holes through which the metal contacts are electrically connected to the electronic device.

3. The accessory apparatus according to claim 1, wherein the page-turning button is disposed on the support member.

4. The accessory apparatus according to claim 1, wherein the page-turning button is a page-turning button on the right side, and the accessory apparatus further comprises a page-turning button on the left side, wherein the page-turning button on the left side is electrically connected to the flexible printed circuit by a wire, wherein the wire is buried in a material of the protective cover.

5. The accessory apparatus according to claim 1, wherein the flexible printed circuit is located between the protective cover and the support member.

6. The accessory apparatus according to claim 1, wherein side walls of the first convex portion and the second convex portion are respectively provided with a block; side walls of the first concave portion and the second concave portion are respectively provided with a slot that is engaged with the block.

7. The accessory apparatus according to claim 6, wherein the support member has a third concave portion for accommodating the page-turning triggering device, and the page-turning button is in contact with the page-turning triggering device through the third concave portion.

8. An electronic device, comprising contacts, wherein the contacts receive the page-turning instruction from the accessory apparatus according to claim 1, to perform the page-turning operation.

9. The electronic device according to claim 8, wherein the electronic device is electrically connected to the flexible printed circuit through a circuit interface of the flexible printed circuit.

10. The electronic device according to claim 9, wherein the circuit interface is a plurality of metal contacts, and the protective cover has a plurality of holes through which the metal contacts are in contact with the contacts of the electronic device.

11. An electronic device assembly, comprising:
an electronic device;
a protective cover, which partially or completely wraps the electronic device and directly attaches to a back of the electronic device, wherein the protective cover is connected to an outer surface of the electronic device;
a page-turning button, which is configured to perform a page-turning operation;
a flexible printed circuit, which is provided with a page-turning triggering device, wherein the page-turning triggering device is in contact with the page-turning button, and is configured to detect a page-turning instruction in response to the page-turning operation , and wherein the page-turning instruction is transmitted to the electronic device by the flexible printed circuit;
a support member, which is configured to support the flexible printed circuit; and
wherein the page-turning button has a first convex portion disposed at a first end and a second convex portion disposed at a second end, and the support member has a first concave portion for fitting the first convex portion and a second concave portion for fitting the second convex portion.

12. The electronic device assembly according to claim 11, wherein the flexible printed circuit has a circuit interface for electrically connecting with the electronic device, the circuit interface is a plurality of metal contacts, the electronic device is provided with contacts corresponding to the plurality of metal contacts, and the protective cover has a plurality of holes through which the metal contacts are electrically connected to the electronic device.

13. The electronic device assembly according to claim 11, wherein the page-turning button is disposed on the support member.

14. The electronic device assembly according to claim 11, wherein the page-turning button is a page-turning button on the right side, and the electronic device assembly further comprises a page-turning button on the left side, wherein the page-turning button on the left side is electrically connected to the flexible printed circuit by a wire, wherein the wire is buried in a material of the protective cover.

15. The electronic device assembly according to claim 11, wherein the flexible printed circuit is located between the protective cover and the support member.

16. The electronic device assembly according to claim 11, wherein side walls of the first convex portion and the second convex portion are respectively provided with a block; side walls of the first concave portion and the second concave portion are respectively provided with a slot that is engaged with the block.

17. The electronic device assembly according to claim 16, wherein the support member has a third concave portion for accommodating the page-turning triggering device, and the page-turning button is in contact with the page-turning triggering device through the third concave portion.

* * * * *